United States Patent [19]
Rogers

[11] Patent Number: 6,081,071
[45] Date of Patent: Jun. 27, 2000

[54] ELECTROLUMINESCENT APPARATUS AND METHODS OF MANUFACTURING AND ENCAPSULATING

[75] Inventor: Stephen P. Rogers, Phoenix, Ariz.

[73] Assignee: Motorola, Inc., Schaumburg, Ill.

[21] Appl. No.: 09/080,111

[22] Filed: May 18, 1998

[51] Int. Cl.[7] ................ H01J 1/62; F21V 9/16; F21V 29/00
[52] U.S. Cl. ............... 313/512; 362/84; 362/267
[58] Field of Search ............ 362/84, 267; 313/500, 313/506, 511, 512

[56] References Cited

U.S. PATENT DOCUMENTS

| | | | |
|---|---|---|---|
| 4,829,213 | 5/1989 | Pecile et al. | 313/509 |
| 4,839,557 | 6/1989 | Schrank | 313/509 |
| 5,239,228 | 8/1993 | Taniguchi et al. | 313/512 |
| 5,322,161 | 6/1994 | Schichman et al. | 206/204 |

Primary Examiner—Cassandra Spyrou
Assistant Examiner—Jared Treas
Attorney, Agent, or Firm—Eugene A. Parsons; William E. Koch

[57] ABSTRACT

Packaged electroluminescent apparatus including an organic electroluminescent device carried by a glass substrate and a glass cover sealed with the glass substrate at a perimeter seal bounding the organic electroluminescent device in a cavity. Wherein the perimeter seal includes a cured epoxy adhesive seal sealingly engaging the glass cover with the glass substrate, and desiccant and/or inert fluorocarbon liquid disposed proximate the cured epoxy adhesive.

9 Claims, 2 Drawing Sheets

6,081,071

ELECTROLUMINESCENT APPARATUS AND METHODS OF MANUFACTURING AND ENCAPSULATING

FIELD OF THE INVENTION

This invention relates generally to the field of electroluminescent apparatus and, more particularly, to organic electroluminescent apparatus and improved methods of manufacturing and encapsulating organic electroluminescent apparatus.

BACKGROUND OF THE INVENTION

Electroluminescent (EL) apparatus may be classified as organic or inorganic. Electroluminescent apparatus exhibit high visibility due to inherent self-emission characteristics and provide excellent impact resistance and handling ability. As a result, research, development and practical utilization of EL apparatus as a pixel for graphic display, a pixel for a television image display and as a light source are currently underway.

Organic EL apparatus include a laminate structure having, among other things, a light-emitting layer formed of a fluorescent organic solid and deposited between a pair of electrodes. This laminate structure is normally formed on a substrate such as glass. The foregoing type of organic EL apparatus utilize light emission provided when electrons injected into the light-emitting layer are recombined. As a result, organic EL apparatus actuates at a low voltage and exhibits a level of brightness proportional to the injected electric current. By changing the type of fluorescent organic solids comprising the light-emitting layer, light emission may be obtained through substantially the entire visible light region.

The fluorescent organic solids commonly used to form the light-emitting layer of organic EL apparatus are susceptible to water, oxygen and other environmental elements. Furthermore, the electrode normally formed on the light-emitting layer is also prone to oxidation from exposure to water, oxygen, etc. As a result, conventional organic EL apparatus exhibit a short life as a usable device in atmospheric conditions. To increase the life of organic EL apparatus, the electrode and the light emitting layer must be protected from water, oxygen and other environmental elements.

To increase the life of organic EL apparatus in this regard, various methods and techniques have been devised for encapsulating organic EL apparatus with protective layers of varying compositions. Although exemplary, such methods and techniques are difficult and expensive to implement, require specialized processing equipment or techniques, and/or yield largely nominal results.

Accordingly, it would be highly desirable to provide an improved organic EL apparatus and improved methods of encapsulating organic EL apparatus.

It is a purpose of the present invention to provide a new and improved method of encapsulating organic EL apparatus.

It is another purpose of the present invention to provide a new and improved method of encapsulating organic EL apparatus that is easy to implement.

It is still another purpose of the present invention to provide a new and improved method of encapsulating organic EL apparatus that is inexpensive.

It is a further purpose of the present invention to provide a new and improved organic EL apparatus that is inexpensive and highly resistant to water, oxygen and other environmental elements.

SUMMARY OF THE INVENTION

The above problems and others are at least partially solved and the above purposes and others are realized in new and improved packaged organic EL apparatus (herein including one or more EL devices or pixels on one or more substrates) and improved methods of manufacturing and encapsulating organic EL apparatus. In a specific embodiment, packaged organic EL apparatus is generally comprised of an organic electroluminescent device carried by a glass substrate and a glass cover sealed with the glass substrate at a perimeter seal bounding the organic electroluminescent device in a cavity. The perimeter seal is generally comprised of a cured epoxy adhesive seal sealingly engaging the glass cover with the glass substrate, and desiccant and/or inert fluorocarbon liquid disposed proximate the cured epoxy adhesive.

Consistent with the foregoing, associated methods of manufacturing and encapsulating organic EL apparatus may also be provided.

BRIEF DESCRIPTION OF THE DRAWINGS

The foregoing and further and more specific objects and advantages of the instant invention will become readily apparent to those skilled in the art from the following detailed description thereof taken in conjunction with the drawings in which.

DETAILED DESCRIPTION OF A PREFERRED EMBODIMENT

The present invention provides, among other things, improved packaged organic EL apparatus and improved methods of manufacturing and encapsulating organic EL apparatus (herein including one or more EL devices or pixels on one or more substrates) and, more particularly, encapsulating active organic regions of organic EL apparatus. The present invention incorporates a glass-to-glass encapsulation scheme including, among other things, a thin film or layer of desiccant and/or inert fluorocarbon liquid in combination with a UV light-cured perimeter seal to bound at least an active organic region of an EL device in an environmentally controlled cavity.

Figure 1:
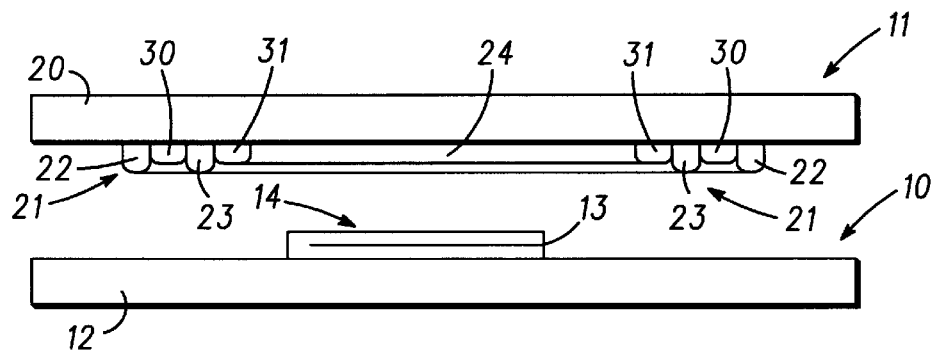
FIG. 1 illustrates a sectional view of organic EL apparatus and a cover spaced from organic EL apparatus, in accordance with the present invention.

Turning to FIG. 1, illustrated is a sectional view of an organic EL apparatus 10 and a cover 11 spaced from apparatus 10, in accordance with the present invention. Apparatus 10 is generally comprised of a laminate structure mounted with a glass substrate 12, the laminate structure generally defining an organic EL device 13 having, in this specific example, a display area or active organic region generally denoted at 14. While a single EL device 13 is disclosed herein for simplicity, it will be understood that single or multiple EL devices can be incorporated. The various structural features of apparatus 10 represent conventional constitutions of known organic EL apparatus, further details of which will not be herein further addressed as they will readily occur to the skilled artisan.

Figure 3:
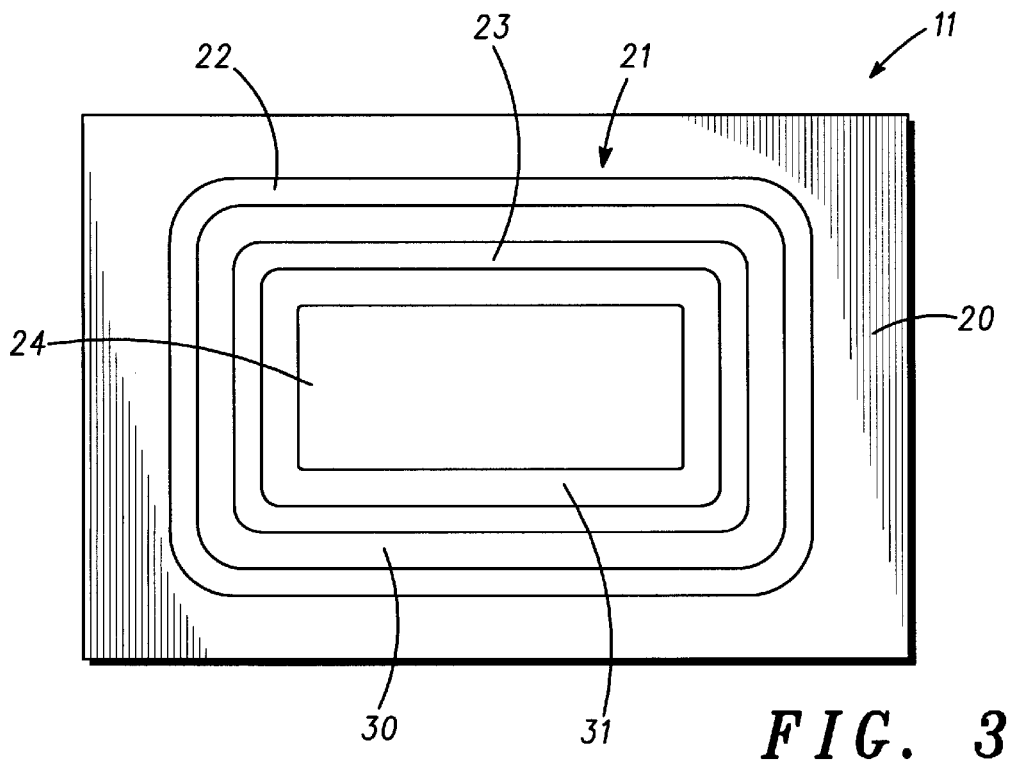
FIG. 3 illustrates a bottom plan view of the cover of FIG. 1.

Cover 11 is generally comprised of a cover sheet 20 constructed of glass or a substantially similar and suitable substantially rigid and transparent material. With additional reference to FIG. 3 illustrating a bottom plan view of cover 11, carried by or otherwise depending from sheet 20 is a perimeter seal generally denoted at 21. In this specific example, perimeter seal is comprised of substantially concentric first and second seals 22 and 23. First and second seals 22 and 23 are each continuous and constructed of printed or patterned adhesive such as epoxy, and in a preferred embodiment, an ultraviolet light-curable epoxy adhesive. As shown in FIG. 1, second seal 23 and sheet 20 cooperate together generally to bound a cavity 24.

With continuing reference to FIGS. 1 and 3, perimeter seal 21 further includes desiccant and/or inert fluorocarbon liquid 30 disposed as a substantially continuous layer or film between first and second seals 22 and 23. In a specific example, the desiccant includes materials such as dehydrated metal halides, salts or the like. Preferably, cobalt chloride (CoC12) is employed, although one or more other desiccants may be used if so desired. The inert fluorocarbon liquid preferably includes FC40, FC43, FC70 or the like, although one or more commercially available, materials under the exemplary trademark FLUORONERT$^{(R)}$ may be used if so desired. Also included in this specific example is desiccant and/or inert fluorocarbon liquid 31 disposed as a substantially continuous layer or film directly inboard of second seal 23. Desiccant and/or inert fluorocarbon liquid 31 may be any of the materials described previously for desiccant and/or inert fluorocarbon liquid 30.

Figure 2:
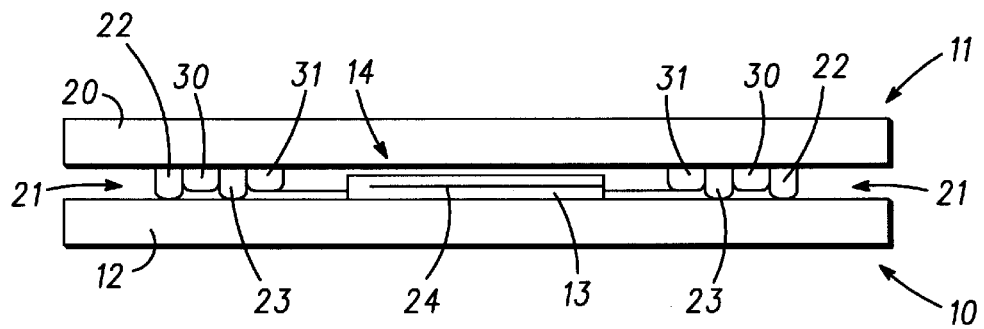
FIG. 2 illustrates a sectional view of organic EL apparatus of FIG. 1 as it would appear packaged or otherwise encapsulated with the cover.

Like conventional organic EL apparatus, device 13 will degrade rapidly under normal ambient conditions from exposure to, for instance, water and oxygen. To protect or otherwise insulate apparatus 10, and more particularly device 13 of apparatus 10, from exposure to the ambient environment, cover 11 may be fixed with apparatus 10 for packaging, bounding or otherwise containing device 13 in an environmentally controlled environment defined generally by cavity 24. In this regard, FIG. 2 illustrates a sectional view of apparatus 10 as it would appear packaged or encapsulated. So encapsulated or packaged, sheet 20 is shown adhesively sealed with glass substrate 12 in substantially parallel relation relative substrate 12 at and by perimeter seal 21 via first and second seals 22 and 23 with sheet 20 and perimeter seal 21, and more particularly second seal 23 of perimeter seal 21, bounding or otherwise containing device 13 in cavity 24.

With sheet 20 and substrate 12 sealed to encapsulate device 13 as set forth in FIG. 2, sheet 20, substrate 12 and perimeter seal 21 cooperate to define substantially impermeable barriers for protecting device 13 from exposure to water, oxygen and other potential ambient environmental conditions that may otherwise result in the degradation of device 13. Cavity 24 thus defines a controlled environment within which device 13 may operate.

In a preferred method of packaging or encapsulating electroluminescent apparatus, provided is an organic EL apparatus 10 of a type having EL device 13 carried by substrate 12 preferably constructed of glass or other similar and suitable substantially rigid and transparent material. Cover 11 is provided and includes a cover sheet 20 constructed of glass, plastic or other similar and suitable substantially rigid and transparent material. Perimeter seal 21 including one or more perimeter seals 22 and 23 are formed on cover sheet 20. Consistent with the ensuing discussion, perimeter seal 21 functions to sealingly engage cover sheet 20 with substrate 12 of organic EL apparatus 10 to encapsulate or otherwise package EL device 13 in a cavity bound by perimeter seal 21.

Prior to the dispensing or patterning of the epoxy adhesive comprising each of the first and second seals 22 and 23, the method includes depositing desiccant and/or inert fluorocarbon liquid 30, on cover sheet 20. Deposition of desiccant and/or inert fluorocarbon liquid 30 is preferably carried out so as to define areas for the deposition of first and second seals 22 and 23 and, as an option, desiccant and/or inert fluorocarbon liquid 31 is deposited directly inboard of the area for second seal 23 bounding the cavity.

In a particular embodiment, deposition of desiccant includes providing a substantially saturated solution of desiccant, dispensing the desiccant solution between the areas defining first and second seals 22 and 23 and, if desired, directly inboard of the area defining second seal 23 bounding the cavity of the cover to form substantially continuous layers of the desiccant solution. After dispensing, the deposition of desiccant further includes evacuating and heating or otherwise drying the solution to leave desiccant as a solid in the form of a substantially continuous layer or film 30 between the areas defining first and second seals 22 and 23 and, optionally, as a substantially continuous layer or film 31 directly inboard of the area defining second seal 23 bounding the cavity. While desiccant 31 is illustrated as a continuous ring in FIG. 1, it will be understood that desiccant 31 can substantially fill the cavity bounded by second seal 23.

It will be readily understood that the deposition of desiccant as set forth above may be repeated as desired for allowing the amount of desiccant deposited to be controlled or otherwise varied depending on specific needs.

Once the desiccant is patterned and dried and/or the inert fluorocarbon is patterned, perimeter seal 21 is patterned onto the defined areas of cover sheet 20. Perimeter seal 21, in a specific embodiment, is mounted to cover sheet 20 by conventional printing or patterning techniques. Material used for seal 21 includes epoxy adhesive and, more particularly, an ultraviolet light-curable epoxy adhesive formed of continuous substantially concentric first and second rings or seals 22 and 23, with one of the first and second rings or seals cooperating with cover sheet 20 to bound or otherwise generally define a cavity. After patterning or printing, the method further includes curing the epoxy. Because the epoxy is preferably an ultraviolet light-curable epoxy, curing the epoxy may include exposing the epoxy to ultraviolet light for a predetermined duration at a predetermined intensity.

Regarding technical concerns and options, normally after mounting the epoxy adhesive on the cover sheet, the cover sheet and adhesive may be left to stand with the epoxy adhesive facing down in an inert ambient environment at about 29° C. for about one hour to remove bubbles and allow the adhesive to flow to an equilibrium height of about 75 $\mu$m–100 $\mu$m. During this setting time, the temperature of the inert ambient environment may be decreased to about 25° C. to increase the viscosity of the epoxy adhesive if desired, after which the epoxy may be exposed to ultraviolet light for curing.

In the preferred embodiment during the formation of cover 11, desiccant and/or inert fluorocarbon 30 and 31 are deposited prior to the formation of perimeter seal 21, however, the procedure can be reversed if desired, with desiccant and/or inert fluorocarbon 30 and 31 deposited after formation of perimeter seal 21. When a desiccant is employed for 30 and 31 and deposited prior to the formation of perimeter seal 21, a desiccant solution is patterned on cover sheet 21 and heated in an evacuated chamber to remove liquids. The remaining solid is desiccant 30 and/or 31. When an inert fluorocarbon is used as one of 30 and 31 or as a portion of 30 and 31, the desiccant must be deposited and liquids removed prior to the deposition of the inert fluorocarbon. It is also contemplated that only inert fluorocarbons are used as a barrier medium without the use of a desiccant. Once cover sheet 20 has been patterned with desiccant and/or inert fluorocarbon 30 and/or 31, perimeter seal 21 is formed as described previously using U.V. curable epoxy.

Cover sheet 20 is sealed to the substrate of organic EL apparatus 10 to package EL device 13 in the cavity by first depositing the epoxy by patterning or printing techniques as described above to form first and second seals 22 and 23. The organic EL apparatus and the cover are pressed together such that the epoxy of the first and second seals engages and seals with the glass substrate, bounding the EL device in the cavity. To complete the encapsulation of the EL device, the method further includes the step of curing the epoxy. If the epoxy is comprised of an ultraviolet light curable epoxy, the step of curing further includes exposing the epoxy to ultraviolet light for a predetermined duration and a predetermined intensity. Because one or both the substrate of EL apparatus and the cover sheet of the cover are preferably constructed of transparent material, exposure of first and second seals to ultraviolet light for curing may be carried through one or both of the substrate and the cover sheet.

An important benefit of the preferred glass-to-glass encapsulation of the EL device as set forth is the ability to expose the perimeter seal to ultraviolet light for curing in directions from at least one of either the substrate of EL apparatus and the cover sheet of the cover.

Figure 4:
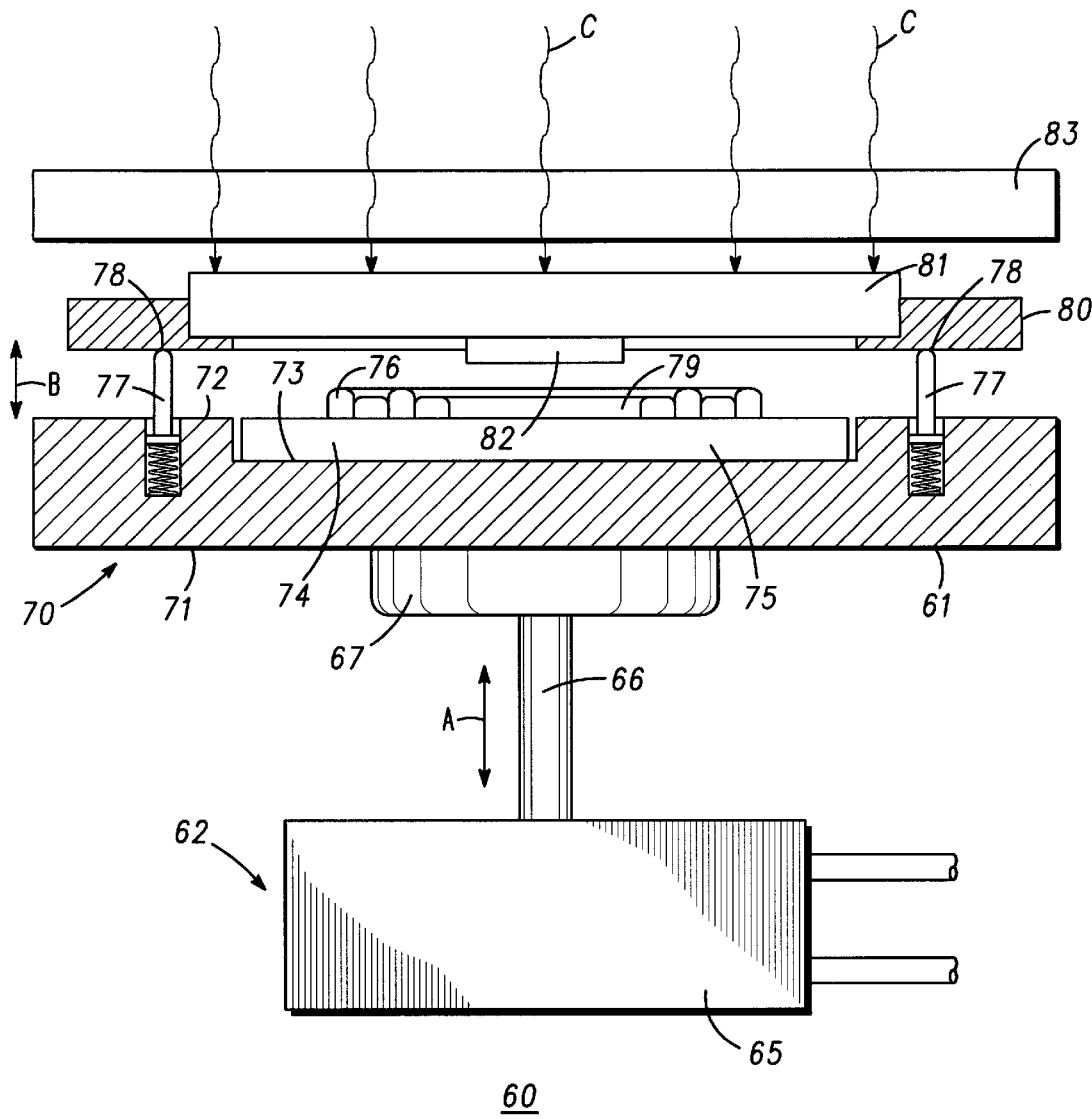
FIG. 4 illustrates a sectional view of a press for pressing the cover against organic EL apparatus of FIG. 1.

Regarding FIG. 4, illustrated is a sectional view of an example of a press 60 for pressing one of the cover sheet and the organic EL apparatus to seal the cover sheet with organic EL apparatus at the perimeter seal. Press 60 is generally comprised of a support 61 mounted with a supporting structure 62. Supporting structure 62 is operative for moving support 61 in reciprocal directions as indicated generally by the double arrowed line A. In a specific embodiment, supporting structure 62 is comprised of a base 65 and an a cylinder assembly 66 extending outwardly therefrom and terminating in supporting engagement with support 61 via, in this specific example, a boss 67.

With continuing reference to FIG. 4, support 61 is generally comprised of a body 70 including a lower surface 71 directed toward base 65 and an opposing upper surface 72 having a groove or recess 73 formed therein for receiving and supporting a cover 74. Cover 74 includes the same physical constitutions as cover 11 discussed previously in combination with FIGS. 1–3 including a glass cover sheet 75 shown supported in recess 73 and an upwardly directed perimeter seal 76 bounding a cavity 79. Because cover 74 includes the same physical constitutions as cover 11, further details of cover 74 will not be discussed in further detail. It should also be noted that recess 73 in body 70 can be configured to receive, in addition to or instead of cover 11, any preferred sealing structure, such as glass, plastic, stamped metal foils, plastic circuit boards (PCB), ceramic cans, machined metal cans, or semiconductor substrates.

Press 60 further includes a plurality of upstanding pogo-pins 77 supported by support 61 for reciprocating movement as generally indicated by the double arrowed line B and extending outwardly from upper surface 72 and terminating with free ends 78 for engaging and supporting a frame 80 which carries a glass substrate 81 carrying or otherwise supporting an EL device 82 in spaced-apart and in substantial opposition to cover 74 and, more particularly, to cavity 79. Substrate 81 and EL device 82 are substantially identical to EL apparatus 10 discussed previously in combination with FIG. 1, further details of which will not discussed. Press 60 still further includes a stationary ceiling 83 mounted in substantial opposition to upper surface 72 of support 61, ceiling 83 being preferably constructed of optical glass or other substantially transparent material which will transmit light radiation between the wavelengths of approximately 200 nm to 500 nm.

In operation, and with cover 74 and substrate 81 mounted with press 60 as previously described, cylinder assembly 66 may be actuated for moving support 61 toward ceiling 83 to engage glass substrate 81 with ceiling 83. Upon engagement of glass substrate 81 with ceiling 83, pogo pins 77 will permit frame 80 and substrate 81 to move toward cover 74 to pressingly engage and seal perimeter seal 76 against glass substrate 81 packaging or otherwise encapsulating EL device 82 in cavity 79. After engagement, the ultraviolet light-curable adhesive comprising perimeter seal 76 can be cured by ultraviolet light directed through ceiling 83 and glass substrate 81 as indicated by the arrowed lines C.

In summary, the present invention proposes a glass-to-glass encapsulation scheme including a thin film or layer of desiccant and/or inert fluorocarbon in combination with a UV light-cured perimeter seal to bound an EL device of EL apparatus in an environmentally controlled cavity. The desiccant and the glass-to-glass package enhances substantially the operating lifetime of EL apparatus.

The present invention has been described above with reference to a preferred embodiment. However, those skilled in the art will recognize that changes and modifications may be made in the described embodiments without departing from the nature and scope of the present invention. Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

What is claimed is:

1. Packaged electroluminescent apparatus, comprising: an organic electroluminescent device carried by a transparent substrate; a cover; a perimeter seal, defined by substantially concentric first and second cured adhesive rings, the perimeter seal bounding the organic electroluminescent device in a cavity, wherein the perimeter seal sealingly engages the cover with the transparent substrate; and at least one of a desiccant and an inert fluorocarbon liquid disposed between the first and second cured adhesive rings of the perimeter seal and is inboard of the second cured adhesive ring.

2. The packaged electroluminescent apparatus of claim 1, wherein the perimeter seal is further comprised of substantially concentric first and second cured epoxy adhesive rings.

3. The packaged electroluminescent apparatus of claim 2, wherein the cured epoxy adhesive rings are further comprised of substantially concentric first and second ultraviolet light-cured epoxy adhesive rings.

4. The packaged electroluminescent apparatus of claim 1, wherein the desiccant includes one of dehydrated metal halides and salts.

5. The packaged electroluminescent apparatus of claim 4, wherein the desiccant includes cobalt chloride.

6. The packaged electroluminescent apparatus of claim 1, wherein the at least one of a desiccant and an inert fluorocarbon liquid is disposed inboard of one of the first and second cured adhesive rings in the cavity.

7. The packaged electroluminescent apparatus of claim 4, wherein the desiccant is disposed between the first and second ultraviolet light-cured epoxy adhesive rings and inboard of one of the first and second ultraviolet light-cured epoxy adhesive rings in the cavity.

8. The packaged electroluminescent apparatus of claim 1, wherein the transparent substrate and the cover both include glass.

9. The packaged electroluminescent apparatus of claim 1, wherein the cover includes at least one of glass, plastic, stamped metal foils, plastic circuit boards (PCB), ceramic cans, machined metal cans, and semiconductor substrates.

\* \* \* \* \*